(12) United States Patent
Scharinger et al.

(10) Patent No.: US 10,104,808 B2
(45) Date of Patent: Oct. 16, 2018

(54) HEAT SINK AND HOUSING FOR AN INVERTER WITH SUCH A HEAT SINK

(71) Applicant: Fronius International GmbH, Pettenbach (AT)

(72) Inventors: David Scharinger, Voecklabruck (AT); Helmut Pfluegelmeier, Eferding (AT); Ronald Leitgeb, St. Salvator (AT); Patrick Hauser, Wels (AT); Franz Windischbauer, Weisskirchen (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 149 days.

(21) Appl. No.: 14/719,536

(22) Filed: May 22, 2015

(65) Prior Publication Data
US 2015/0342091 A1    Nov. 26, 2015

(30) Foreign Application Priority Data

May 23, 2014   (AT) .............................. A 50370/2014

(51) Int. Cl.
*H05K 7/20*     (2006.01)
*H01L 23/467*   (2006.01)
*H01L 23/367*   (2006.01)

(52) U.S. Cl.
CPC ....... *H05K 7/20418* (2013.01); *H01L 23/467* (2013.01); *H05K 7/20909* (2013.01); *H01L 23/3672* (2013.01); *H01L 2924/0002* (2013.01)

(58) Field of Classification Search
CPC ............ H05K 7/20418; H05K 7/20909; H01L 23/467; H01L 23/3672; H01L 2924/0002
(Continued)

(56) References Cited

U.S. PATENT DOCUMENTS

| 4,715,438 | A |   | 12/1987 | Gabuzda et al. |
| 5,437,327 | A | * | 8/1995 | Chiou ....................... F28F 3/02 165/122 |

(Continued)

FOREIGN PATENT DOCUMENTS

| CN | 2161998 Y | 4/1994 |
| CN | 1411332 A | 4/2003 |

(Continued)

OTHER PUBLICATIONS

Chinese Office Action in CN 201510266834.1, dated Feb. 6, 2017, with English translation of relevant parts.

(Continued)

*Primary Examiner* — Raheena R Malik
(74) *Attorney, Agent, or Firm* — Collard & Roe, P.C.

(57) ABSTRACT

A heat sink for cooling electronic power components arranged in a housing includes a cooling element having cooling fins arranged on a base surface, and a fan for intake of ambient air and for delivering the ambient air via the cooling fins of the cooling element, the cooling element having a recess, in which the fan is arranged spaced apart from the base surface. The fan includes a housing ring on the side facing away from the base surface of the cooling element, an intermediate space being formed between the bottom edge of the housing ring and the base surface of the cooling element. The fan is an axial fan, so that the ambient air taken in impinges upon the base surface of the cooling element, is deflected by essentially 90 degrees and guided through the intermediate space laterally between the cooling fins to the outside.

12 Claims, 5 Drawing Sheets

(58) Field of Classification Search
USPC .......................................................... 165/80.3
See application file for complete search history.

(56) References Cited

U.S. PATENT DOCUMENTS

| | | | |
|---|---|---|---|
| 5,522,700 A | 6/1996 | Hong | |
| 5,661,638 A | 8/1997 | Mira | |
| 5,787,971 A | 8/1998 | Dodson | |
| 5,927,385 A * | 7/1999 | Yeh | H01L 23/467 165/121 |
| 5,946,192 A * | 8/1999 | Ishigami | H05K 7/20418 257/719 |
| 6,015,008 A * | 1/2000 | Kogure | F28F 3/02 165/121 |
| 6,170,563 B1 * | 1/2001 | Hsieh | F28F 3/04 165/122 |
| 6,401,808 B1 * | 6/2002 | Hanzlik | H01L 23/467 165/121 |
| 6,404,634 B1 * | 6/2002 | Mann | H01L 23/3672 165/121 |
| 6,466,444 B2 * | 10/2002 | Cheung | F28F 3/02 165/185 |
| 6,505,680 B1 * | 1/2003 | Hegde | H01L 23/467 165/121 |
| 6,543,522 B1 * | 4/2003 | Hegde | F28F 3/02 165/185 |
| 7,193,849 B2 * | 3/2007 | Xu | F04D 29/582 165/80.3 |
| D604,255 S * | 11/2009 | King | D13/179 |
| 8,295,046 B2 * | 10/2012 | St. Rock | H01L 23/467 165/104.33 |
| 2003/0168202 A1 | 9/2003 | Chang | |
| 2005/0150637 A1 | 7/2005 | Tan et al. | |
| 2009/0162203 A1 | 6/2009 | Yoo et al. | |
| 2010/0051232 A1 | 3/2010 | Zhao et al. | |
| 2010/0170657 A1 * | 7/2010 | Kaslusky | H01L 23/467 165/80.3 |
| 2013/0343110 A1 * | 12/2013 | Liu | H02M 7/003 363/141 |

FOREIGN PATENT DOCUMENTS

| | | |
|---|---|---|
| CN | 101469718 A | 7/2009 |
| CN | 101662918 A | 3/2010 |
| CN | 201639903 U | 11/2010 |
| CN | 202840999 U | 3/2013 |
| DE | 42 31 122 A1 | 7/1993 |
| DE | 199 26 007 A1 | 1/2000 |
| JP | 2001-177282 A | 6/2001 |
| JP | 2003-258473 A | 9/2003 |

OTHER PUBLICATIONS

Austrian Office Action in A 50370/2014-1, dated Mar. 11, 2015, with English translation of relevant parts.
Chinese Office Action in Chinese Application No. 201510266834.1, dated Jul. 5, 2017, with English translation.
Chinese Office Action dated Dec. 22, 2017 in Chinese Application No. 201510266834.1 with English translation.
German Examination Report dated Jul. 17, 2018 in DE 10 2015 209 375.1, with English translation of relevant parts.

* cited by examiner

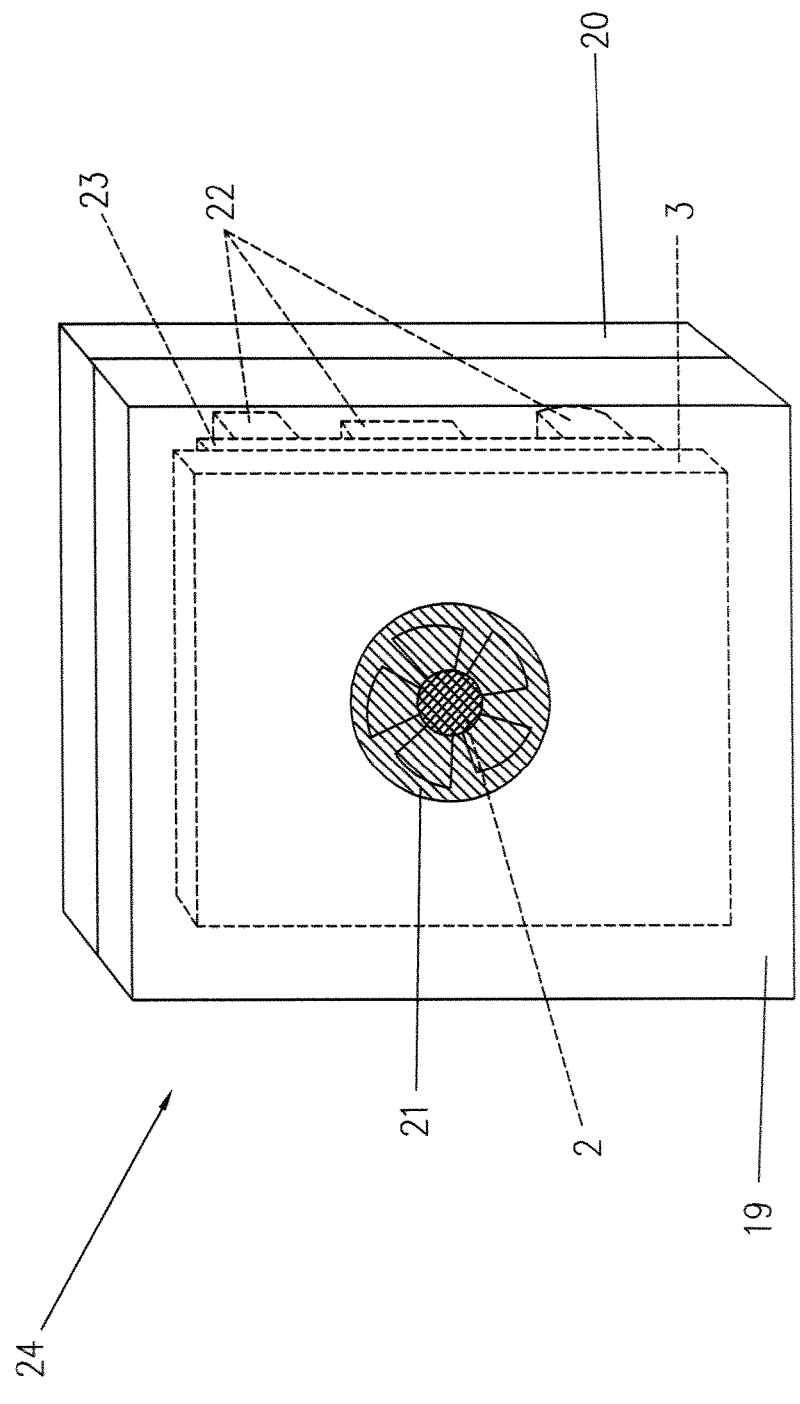

HEAT SINK AND HOUSING FOR AN INVERTER WITH SUCH A HEAT SINK

CROSS REFERENCE TO RELATED APPLICATIONS

Applicant claims priority under 35 U.S.C. § 119 of Austrian Application No. A 50370/2014 filed May 23, 2014, the disclosure of which is incorporated by reference.

BACKGROUND OF THE INVENTION

1. Field of the Invention

The invention relates to a heat sink for cooling electronic power components which are arranged in a housing, comprising a cooling element having cooling fins arranged on a base surface, and a fan for the intake of ambient air and for delivering the ambient air via the cooling fins of the cooling element, the cooling element comprising a recess in which the fan is arranged spaced apart from the base surface of the cooling element.

Furthermore, the invention relates to a housing for an inverter, in particular a photovoltaic inverter, comprising a housing front and a rear housing part.

2. Description of the Related Art

Heat sinks of the present type, including a combination of heat sink and fan, have been known in different variants. The purpose of such heat sinks lies in the efficient dissipation of the heat loss generated by electronic power components.

The heat sink may be used in most varied areas, such as for the cooling of the inverters of photovoltaic systems, for the cooling of power sources in welding technology, and for the cooling of battery charging systems, in which efficient cooling is necessary and which simultaneously should require as little space as possible.

DE 42 31 122 A1, for example, describes a cooling element comprising a fan placed thereupon. The fan takes in the ambient air and delivers it to the cooling element in an essentially perpendicular manner. In the cooling element, the airflow will be deflected by an angle of 90 degrees and guided to the outside through the cooling fins or cooling ribs, respectively. In this variant of embodiment, it has been found to be particular disadvantageous that the fan is mounted directly on the cooling element, thus necessarily resulting in a higher overall height.

Other known heat sinks include cooling elements, whose cooling fins are not arranged towards the outside in a straight manner but in a curved manner. Other variants include cooling fins which are directed in units in parallel to the outside, starting from the center of the cooling element. For example, the US 2005/0150637 A1 shows a heat sink comprising such a cooling element.

Other heat sinks of the present type are known e. g. from U.S. Pat. No. 5,522,700, U.S. Pat. No. 5,787,971, U.S. Pat. No. 5,661,638, and U.S. Pat. No. 4,715,438.

SUMMARY OF THE INVENTION

Starting from the prior art, the object of the present invention is to provide a heat sink and an inverter housing having such a heat sink which makes possible an improved cooling effect and at the same time has a space-saving and compact design. Any drawbacks of known heat sinks are to be avoided or at least reduced.

Said object is obtained by an above cited heat sink, in which the fan has a housing ring arranged on the side facing away from the base surface of the cooling element, an intermediate space being formed between the bottom edge of the housing ring and the base surface of the cooling element, and the fan being formed by an axial fan, so that the ambient air taken in impinges upon the base surface of the cooling element, is deflected by an angle of 90 degrees and guided through the intermediate space laterally between the cooling fins to the outside. The fan used is mounted not directly on the cooling element, but is integrated in a recess in the cooling element and inserted at a certain minimum distance to the base surface of the cooling element. In addition, on the side of the fan facing away from the base surface of the cooling element a housing ring is provided, an intermediate space being formed between the bottom edge of the housing ring and the base surface of the cooling element. This creates fluidically optimal pressure ratios which allow optimum intake of the ambient air as well as flow-through and deflection of the airflow and cause an optimum cooling effect. The skillful integration of the fan in the heat sink and the special arrangement of the cooling fins result in an efficient cooling effect and at the same time a low overall height or optimum space conditions. Due to its design, the heat sink has a wide range of applications, which basically covers all the technical fields in which cooling of electronic components is required or desired. Due to its compact design and, at the same time, very good cooling properties, application thereof is highly appropriate in many areas. In known heat sinks, in which the fan is mounted on the cooling element, such a cooling effect could not be obtained, with at the same time optimum space conditions or a low overall height.

Due to the fact that the fan is formed by an axial fan, the ambient air taken in is deflected in the intermediate space by an angle of 90 degrees and is laterally carried off between the cooling fins of the cooling element to the outside. An optimum cooling capacity, with at the same time very little space needed, may be achieved by means of an axial fan. Integrating a flat axial fan in the recess of the cooling element allows for the realization of a high air delivery volume in connection with minimum space requirement.

In accordance with one feature of the invention, the fan is connected to the cooling element point by point. Thus, the cooling airflow is not impaired considerably by the fixing points.

The height of the housing ring preferably corresponds to half of the overall height of the fan. Due to this, the cooling airflow may pass between the lower edge of the housing ring and the base surface of the cooling element in an optimum manner.

A radially surrounding torus-shaped bulge towards the intake side may be provided on the housing ring of the fan.

Preferably, the fan is flush with the upper edges of the cooling fins of the cooling element or is arranged to extend beyond the upper edges of the cooling fins.

Cooling fins having a lower height than the cooling fins arranged around the recess may likewise be provided in the recess of the cooling element. The cooling effect may be increased further by these cooling fins below the rotor blades of the fan, since very good heat dissipation takes place in the recess already below the fan. The cooling fins disposed in the recess may be arranged at special angles and adapted to the outflow direction, so that a fluidically preferential course of the airflow and an optimum distribution of the cooling air become possible.

At least the majority of the cooling fins are arranged in a manner extending preferably from the recess and radially outwards or in a star pattern around the recess to the outside. Also, the cooling fins may be arranged at least partially in a manner extending in parallel.

The cooling fins may be realized in a straight and/or a curved line. A radial and simultaneously curved shape of the cooling fins yields special advantages, since the cooling air present in the bend of the cooling fins will be guided to the surface of the cooling fins, whereby improved dissipation of heat takes place across the entire length of the cooling fins.

The object is also solved by the above mentioned inverter housing, in which connection a heat sink described above is provided behind the housing front, and an aperture for taking in ambient air is disposed in the housing front. In a housing of a photovoltaic inverter, which is frequently exposed to solar radiation, optimum cooling of the electronic power components of the inverter housed therein is achieved and heating of the inverter housing due to solar radiation is prevented.

The aperture of the housing front is preferably disposed above the fan of the heat sink.

BRIEF DESCRIPTION OF THE DRAWINGS

The invention will be described in detail with reference to the enclosed drawings, in which:

FIG. 6 shows a schematic view of a housing of an inverter with a heat sink integrated therein.

DETAILED DESCRIPTION OF PREFERRED EMBODIMENTS

Figure 1:
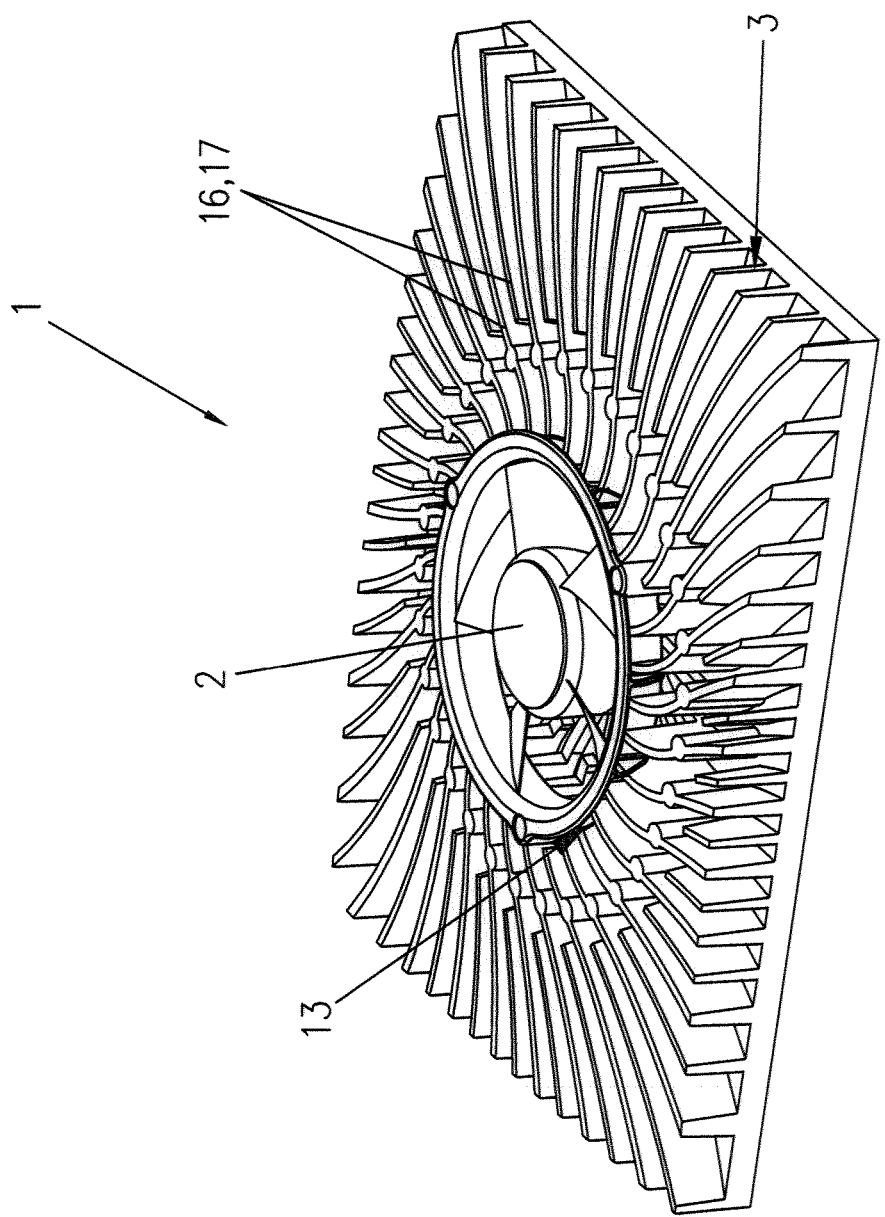
FIG. 1 shows a diagonal view of an embodiment of a heat sink having a cooling element with integrated fan.

FIG. 1 shows a diagonal view of an embodiment of the heat sink 1 according to the invention. The heat sink 1 comprises a combination of a cooling element 3 with integrated fan 2 formed by an axial fan. The fan 2 is integrated in the cooling element 3 in a recess 13. The cooling element 3 comprises a number of cooling fins 16, 17, which are arranged essentially radially or in a star pattern around the recess 13. In the embodiment shown, a short cooling fin 17 is arranged in each case between two long cooling fins 16. In addition to increasing the surface this arrangement causes a division of the airflow and thus an improved cooling effect. Preferably, the fan 2 is placed at a central location of the cooling element 3 in order to achieve uniform distribution of the ambient air taken in across the entire surface of the cooling element 3.

Figure 2:
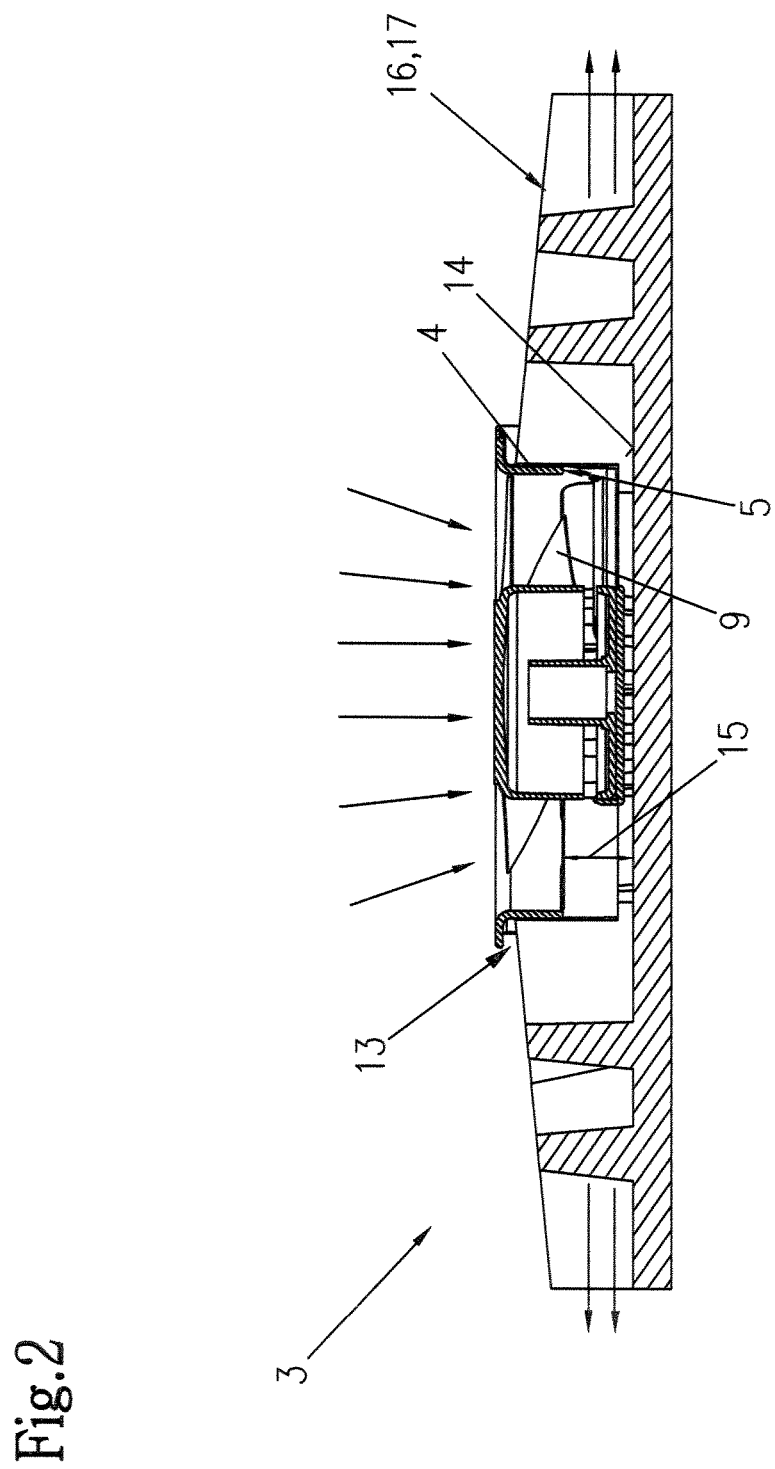
FIG. 2 shows a section through the heat sink with integrated fan according to FIG. 1.

FIG. 2 shows a sectional side view of the heat sink 1 according to the invention. The fan 2 is formed by an axial fan, thus allowing a particularly flat construction of the entire heat sink 1. An axial fan provides for a large air delivery volume and, at the same time, requires little space. The fan 2 is not placed directly on the base surface 14 of the cooling element 3, but spaced apart from it. The fan 2 comprises a housing ring 4, an intermediate space 15 being formed between its bottom edge and the base surface 14 of the cooling element 3. Said intermediate space 15 makes it possible to laterally carry off the airflow taken in from above. It is essential to provide the intermediate space 15 in order to provide optimum pressure ratios between the base surface 14 of the cooling element 3 and the bottom edge 5 of the housing ring 4 of the fan 2. When the fan 2 is in operation, ambient air is taken in from the upper side and through the fan 2, where the cooling air perpendicularly impinges on the base surface 14 of the cooling element 3. Subsequently, the airflow is deflected at an angle of essentially 90 degrees and passed through the intermediate space 15 towards the cooling fins 16, 17, and finally carried off laterally towards the outside. It is essential in this connection that the airflow frontally impinging upon the cooling element 3 is a so-called impingement airflow, which subsequently is necessarily laterally deflected by 90 degrees and laterally carried off.

In the shown embodiment, the fan 2 projects beyond the cooling fins 16, 17 or the upper edges thereof. In their uppermost areas, no cooling air passes through or around the cooling fins 16, 17, for which reason the cooling fins 16, 17 may also be arranged on a deeper level than the fan 2. This also results in a certain amount of material saving. The fan 2, however, may also be placed on such a deep level that it is flush with the cooling fins 16, 17, or it may possibly be placed on an even slightly deeper level. The flow direction of the air taken in is indicated by arrows. The fan 2 takes in the air, whereupon the air impinges on the base surface 14 of the cooling element 3 in a perpendicular manner and is deflected by 90 degrees. Subsequently, the air taken in passes through the intermediate space 15 and then on to the cooling fins 16, 17, thus resulting in heat dissipation.

Figure 3:
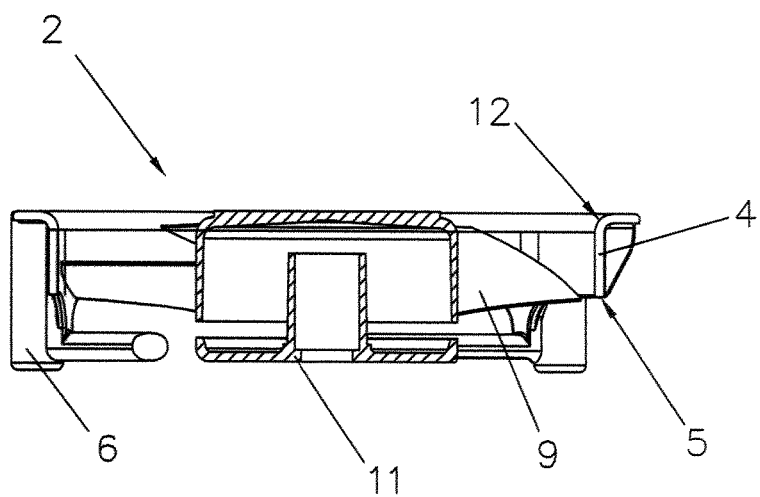
FIG. 3 shows a section through a fan according to the invention.

FIG. 3 now shows a sectional side view of the fan 2 designed as axial fan. The rotor 9 of the fan 2, together with the housing ring 4 and the support plate 11, forms a unit. Certain fastening elements 6 are required to mount the fan 2. If the fan 2 is mounted via its motor, a single fastening element 6 is sufficient. Preferably, the fan 2 is fixed to the housing ring 4 with at least two fastening elements 6. This results in the above-described intermediate space 15, through which the airflow is guided. The height of the intermediate space 15 is determined from the base surface 14 of the cooling element 3 up to the lower edge 5 of the housing ring 4. In principle, this distance or height may be variable. This is essential in so far as only a certain height of the intermediate space 15 may provide an optimum pressure ratio in order to achieve the best possible flow rate of the cooling air. If this distance is too small, it will result in the fact that the air delivery volume reached is not sufficient. As a further result thereof, no sufficient cooling of the cooling element 3 can be obtained. The height between the lower edge 5 of the housing ring 4 and the base surface 14 of the cooling element 3 is of considerable importance and calls for an optimum ratio.

The housing ring 4 of the fan 2 may include a surrounding torus-shaped bulge 12 on the intake side, due to which an intake, which is favorable in terms of fluid mechanics, of the ambient without any interfering edges, and a uniform distribution may take place. If a protruding edge were to form the upper termination of housing ring 4, this would impair the uniformity of the airflow, which in turn leads to undesired swirls. The torus-shaped bulge 12 has the effect that the ambient air taken in shows a uniform inflow. Instead of the torus-shaped bulge 12, for example, a conical form or cone form may also be used.

Figure 4:
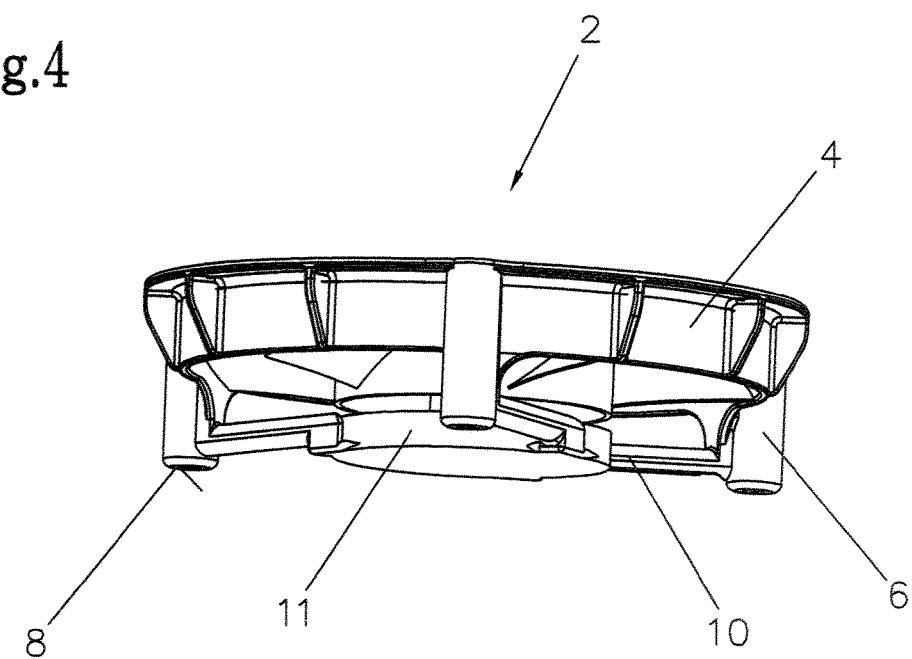
FIG. 4 shows a diagonal view of the fan.
Figure 5:
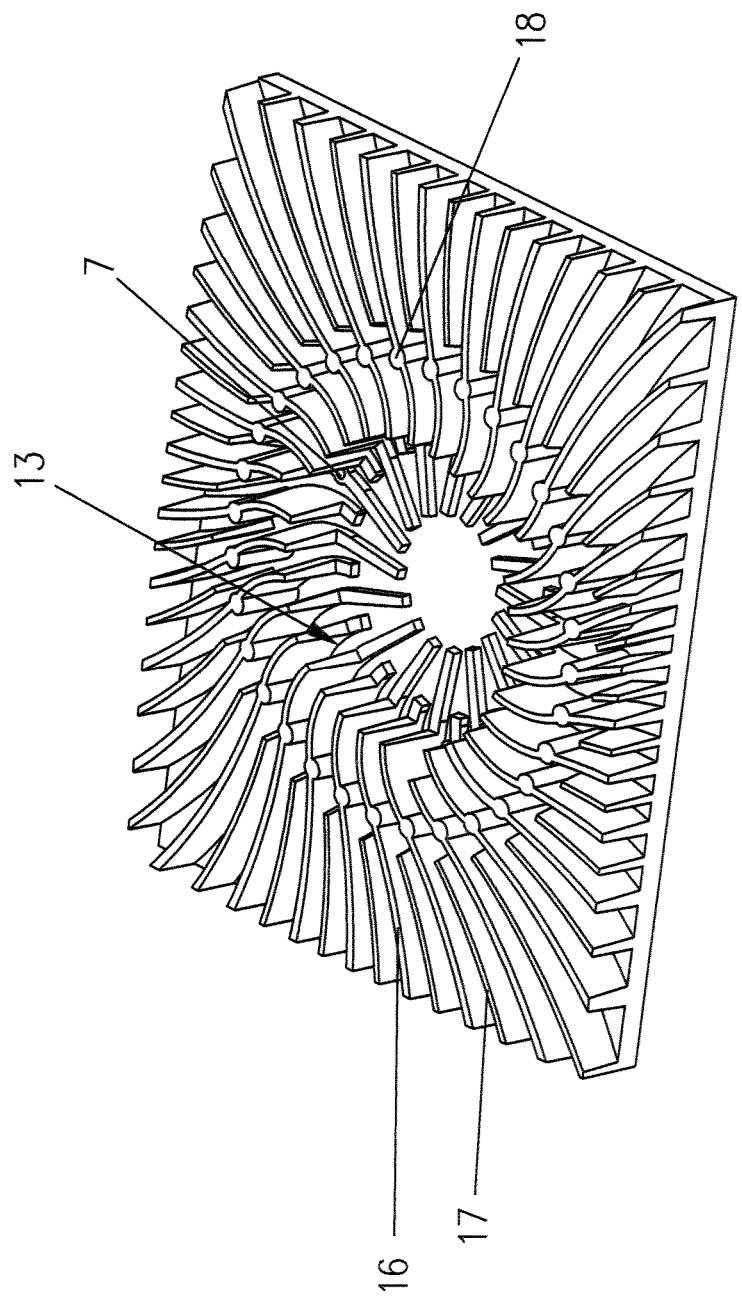
FIG. 5 shows a diagonal top view of the cooling element of the heat sink without fan.

FIG. 4 shows the bottom side of the fan 2 with corresponding mounting areas 8 which rest on the mounting points 7 of the cooling element 3 (see FIG. 5). This constitutes one possible mounting variant. Basically, the locations where the fan 2 is bolted to the cooling element 3 may be located at different places. Basically, the mounting points 7 are placed on the cooling element 3 in such a way that they are located at an uncritical position in terms of fluid mechanics. This is important to not substantially impair the optimal airflow. The fastening elements 6 of the fan 2 are connected to each other and to a support plate 11 disposed centrally by means of connector struts 10. The drive motor of the rotor 9 or the support for the rotor 9 of the fan 2 is supported on the support plate 11. In addition, the connector struts 10 contribute to increasing the rigidity of the fan 2. The electric connection to the drive motor of the fan 2 can also be arranged in one of these connector struts 10. Thus, for instance, one of the connector struts 10 may include a recess, in which the electric connection is guided (not shown).

FIG. 5 finally shows the cooling element 3 with recess 13, without inserted fan 2. The arrangement of the cooling fins 16, 17 is also well shown in this view. Basically, long cooling fins 16 and short cooling fins 17 are arranged. The short cooling fins 17 are employed when the cooling element 3 has a corresponding size. According to FIG. 5, each long cooling fin 16 is followed by at least one short cooling fin 17. The number of short cooling fins 17 increases with the size of the cooling element 3. Cooling fins may also be arranged in the region of recess 13, which constitute extensions of the described arranged cooling fins 16, 17. However, these cooling fins arranged in recess 13 have a smaller height and may be arranged in a manner displaced to one another at a certain angle. This offset relative to one another allows the air taken in and flowing through the fan 2 to be guided to the adjacent cooling fins 16, 17 in a uniform manner and so as to be favorable in terms of fluid mechanics. Insofar, the outflow direction of the ambient air taken in has been adapted and will result in a fluidically optimal course of the airflow. The cooling fins in the region of recess 13 lead to an additional increase in the surface in this region, due to which more heat may be carried off.

The broadenings 18 on the long cooling fins 16 are basically production-related, but may also have a positive effect on the flow pattern of the cooling air. As a matter of fact, the broadenings 18 lead to the fact that the airflow between these locations is guided onto the cooling fins 17 in a manner favorable in terms of fluid mechanics, whereby improved heat dissipation may be achieved. In the shown embodiment, the arrangement of the cooling fins 16, 17 is chosen such that the airflow flows in particular through those locations through which the most heat can be carried off. Finally, the broadenings 18 assist in distributing the airflow to those areas through which the most heat can be carried off.

Of course, the described arrangement of the cooling fins 16, 17 and the broadenings 18 is only exemplary and may vary. Depending on the heat transport required and the possible spatial conditions, a variable arrangement of cooling fins 16, 17 is possible. It may also be the case that the cooling fins 16, 17 themselves are arranged in a manner extending not necessarily in a curved but in a straight to the outside. Likewise, it may be the case that individual pins are used instead of continuous cooling fins. This will result in a corresponding increase of the surface of the cooling element 3. As mentioned earlier, there exists a wide range of possible arrangements and designs of the cooling fins, which therefore will not be discussed any further at this point.

Of course, the fan 2 may also be mounted in a different manner than the one described in FIG. 3 and FIG. 4. Thus, for instance, the fan 2 may also be mounted by means of an adhesive method or the number of the mounting points 7 shown in FIG. 4 may be varied. Furthermore, the fan 2 need not be directly attached to the cooling element 3, but it and/or parts of the fan 2 may also be mounted to an exterior housing, and the fan 2 may be placed into the recess 13 of the cooling element 3 only when assembling the exterior housing.

FIG. 6 shows an application of the heat sink 1 according to the invention in a housing 24 of an inverter, in particular a photovoltaic inverter. The shape of the heat sink 1 is adapted to the inverter. Thus, the fan 2 may also be disposed outside the center, for instance, on the lower edge of the cooling element 3 of the heat sink 1. The inverter housing 24 consists of a front part, the housing front 19, and a rear housing part 20. An aperture 21 for the incoming air is disposed on the housing front 19, whereby the position of the aperture 21 is adapted correspondingly to heat sink 1 arranged behind the housing front 19. In particular, fan 2 of heat sink 1 is arranged behind aperture 21. In the illustrated example, the aperture 21 is centrally arranged on the housing front 19. The aperture 21 may be provided with a ventilation grille, which may be required for safety reasons and, in addition, prevents or reduces contamination of the fan 2 and the components located behind it. A printed circuit board 23, comprising the electronic power components 22 that are arranged thereto and are to be cooled, are located behind the cooling element 3 of heat sink 1. Thus, optimum cooling of the electronic power components 22 can be achieved.

By taking in the cooling air from the side of the housing front 19 and preferably laterally releasing the exhaust air, such an inverter housing 24 may be built or integrated also partially into a wall, thus further reducing the space required.

Of course, the heat sink 1, in addition to the inverter cited here as an example, in particular a photovoltaic inverter, may also be integrated into other systems comprising electronic power components. These have been described in an exemplary way in the introductory part of the description.

What is claimed is:
1. A heat sink for cooling electronic power components which are arranged in a housing, comprising a cooling element having a number of cooling fins arranged on a base surface, and a fan for the intake of ambient air and for delivering the ambient air via the cooling fins of the cooling element, the cooling element having a recess in which the fan is arranged in a manner spaced apart from the base surface of the cooling element,
wherein the fan comprises a housing ring on the side facing away from the base surface of the cooling element, an intermediate space being formed between the bottom edge of the housing ring and the base surface of the cooling element, and the fan being formed by an axial fan, so that the ambient air taken in impinges upon the base surface of the cooling element, is deflected by an angle of 90 degrees and guided through the intermediate space laterally between the cooling fins to the outside,
wherein a radially surrounding torus-shaped bulge is provided towards the intake side on the housing ring of the fan,
wherein, arranged around the recess, the cooling fins comprise a plurality of long cooling fins and a plurality of short cooling fins,
wherein the long cooling fins and the short cooling fins are arranged in an alternating manner such that each short cooling fin is arranged between two long cooling fins, and a broadening is provided on each long cooling fin such that the airflow between the broadenings is guided onto the short cooling fin, wherein additional cooling fins are disposed in the recess of the cooling element, and wherein the additional cooling fins have a smaller height than the long cooling fins and the short cooling fins have.

2. The heat sink according to claim 1, wherein the fan is connected to the cooling element point by point.

3. The heat sink according to claim 1, wherein the height of the housing ring corresponds to half of the overall height of the fan.

4. The heat sink according to claim 1, wherein the fan is arranged so as to extend beyond the upper edges of the long cooling fins.

5. The heat sink according to claim 1, wherein at least the majority of the cooling fins are arranged radially away from the recess towards the outside.

6. The heat sink according to claim 5, wherein the cooling fins are disposed in a straight line.

7. The heat sink according to claim 5, wherein the cooling fins are disposed in a curved line.

8. The heat sink according to claim 1, wherein a top surface of the fan is flush with upper edges of the long cooling fins.

9. The heat sink according to claim 1, wherein a height of the long cooling fins and the short cooling fins decreases in an outward direction.

10. An inverter housing for an inverter, comprising a housing front and a rear housing part, wherein behind the housing front a heat sink according to claim 1 is provided, an aperture for the intake of ambient air being disposed in the housing front.

11. The inverter housing according to claim 10, wherein the aperture is arranged above the fan of the heat sink.

12. The inverter housing according to claim 10, wherein the inverter is a photovoltaic inverter.

* * * * *